United States Patent
Niu et al.

(10) Patent No.: US 8,703,545 B2
(45) Date of Patent: Apr. 22, 2014

(54) ALUMINUM ALLOY LEAD-FRAME AND ITS USE IN FABRICATION OF POWER SEMICONDUCTOR PACKAGE

(75) Inventors: Zhiqiang Niu, Songjiang (CN); Ming-Chen Lu, Songjiang (CN); Yan Xun Xue, Los Gatos, CA (US); Yan Huo, Songjiang (CN); Hua Pan, Songjiang (CN); Guo Feng Lian, Songjiang (CN); Jun Lu, San Jose, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 120 days.

(21) Appl. No.: 13/408,185

(22) Filed: Feb. 29, 2012

(65) Prior Publication Data

US 2013/0221507 A1    Aug. 29, 2013

(51) Int. Cl.
*H01L 21/56* (2006.01)
*H01L 23/495* (2006.01)

(52) U.S. Cl.
USPC ............ 438/123; 438/111; 438/112; 438/124

(58) Field of Classification Search
USPC .......................................... 438/112; 257/736
See application file for complete search history.

(56) References Cited

U.S. PATENT DOCUMENTS

| | | | | |
|---|---|---|---|---|
| 5,994,767 A * | 11/1999 | Huang et al. | .................. | 257/666 |
| 7,148,085 B2 * | 12/2006 | Abbott et al. | ................. | 438/123 |
| 2001/0020500 A1 * | 9/2001 | Smolej et al. | ................. | 148/550 |
| 2003/0107112 A1 * | 6/2003 | Tellkamp | ...................... | 257/666 |
| 2012/0248591 A1 * | 10/2012 | Kure et al. | ..................... | 257/676 |

* cited by examiner

*Primary Examiner* — Angel Roman
(74) *Attorney, Agent, or Firm* — Chein-Hwa Tsao; C H Emily LLC

(57) ABSTRACT

A semiconductor package is provided with an Aluminum alloy lead-frame without noble metal plated on the Aluminum base lead-frame. Aluminum alloy material with proper alloy composition and ratio for making an aluminum alloy lead-frame is provided. The aluminum alloy lead-frame is electro-plated with a first metal electroplating layer, a second electroplating layer and a third electroplating layer in a sequence. The lead-frame electroplated with the first, second and third metal electroplating layers is then used in the fabrication process of a power semiconductor package including chip connecting, wire bonding, and plastic molding. After the molding process, the area of the lead-frame not covered by the molding compound is electroplated with a fourth metal electroplating layer that is not easy to be oxidized when exposing to air.

25 Claims, 5 Drawing Sheets

ALUMINUM ALLOY LEAD-FRAME AND ITS USE IN FABRICATION OF POWER SEMICONDUCTOR PACKAGE

FIELD OF THE INVENTION

The invention generally relates to a lead-frame, particularly, the invention aims at providing an aluminum alloy lead-frame for a power semiconductor package.

BACKGROUND OF THE INVENTION

Different from BGA (Ball Grid Array) types of package, lead-frames have been widely used in packaging power devices and the likes. A metal lead-frame is normally used in a power device with larger power consumption, small size and good heat dissipation. In prior arts, the lead-frame used in the power semiconductor devices is usually made of copper alloy or other metal alloy materials. Under currently technical conditions, the lead-frame made of an aluminum alloy material is extremely difficult to apply in mass production. The problem is that when the aluminum alloy material is punched or bent, it is easy to crack or break.

In addition, aluminum alloy is very easy to be oxidized when it is exposed to air, and the oxides formed on the surface of the aluminum alloy causes poor electrical interconnection between the aluminum lead frame to the semiconductor chips or other functional units.

US patent publication number 2010/0009500 discloses a manufacturing process of a lead-frame made from an aluminum alloy material with a noble metal electroplating layer deposited on the lead-frame. However, noble metal is expensive, so it is not suitable for industrial production on a large scale. As such, this method can only stay at an experimental level or a theoretical level.

In light of these problems, this invention provides a method of manufacturing an aluminum alloy lead frame without noble metal plating and its use to produce a power semiconductor device.

BRIEF DESCRIPTION OF THE DRAWINGS

As shown in attached drawings, the embodiment of the invention is more sufficiently described. However, the attached drawings are only used for explaining and illustrating rather than limit the scope of the invention.

FIG. 8A-2 is a top view diagram illustrating a segment of the lead-frame of FIG. 8A-1 including a punching angle.

DETAILED DESCRIPTION OF THE EMBODIMENTS

Figure 1A:
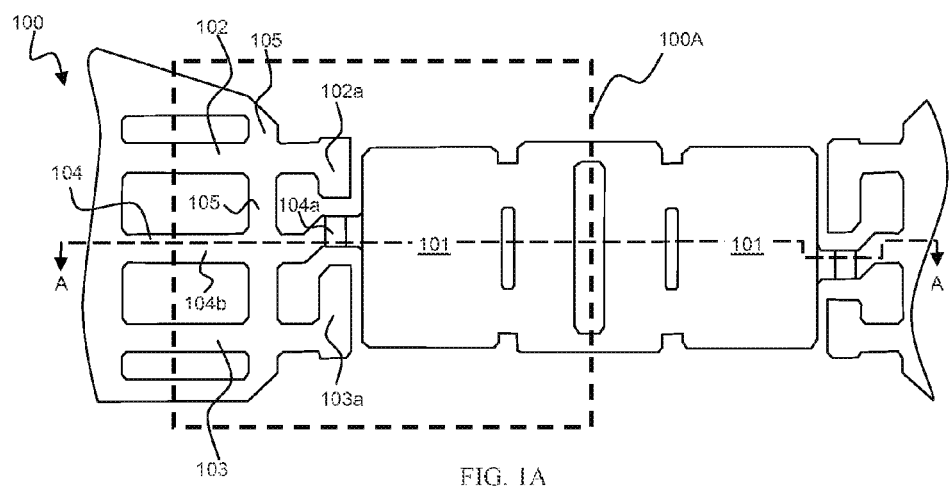
FIG. 1A is a top view diagram of a lead-frame.

As shown in FIG. 1A, the aluminum alloy lead-frame 100, in general, comprises a plurality of lead-frame units 100A, each of which is framed by dotted lines in FIG. 1A and comprises one or more chip mounting areas 101 (chip bonding pads, only one shown in each lead-frame unit) and a plurality of pins 102, 103 and 104 and other pins (not shown) arranged adjacent to the chip mounting area 101. The pins 102, 103 include pin connecting areas 102a, 103a and external pins 102b, 103b respectively. The pin 104 includes an internal pin 104a and an external pin 104b. Optionally, the pins 102, 103 and 104 are connected together by a connecting band 105 or to the other parts of the lead-frame 100 (not shown) that physically support the pins to prevent unexpected deformations such as torsion or bending. Alternatively, other types of lead-frames or other structures of the lead-frame unit (not shown) also can be used. Moreover, the scope of the invention is illustrated by schematic structures, but is not limited by the structures described in figures.

As mentioned above, the lead-frame made from the aluminum alloy material is easy to crack and break when it is punched or bent. Therefore, proper raw materials are selected for making the aluminum alloy lead-frame. Moreover, the hardness and flexibility of the lead-frame are optimized by the alloy composition and ratio so that the lead-frame can handle a punching force in a certain range or will not be cracked when it is bent. In a preferred embodiment, the composition and ratio of the aluminum alloy material for the lead-frame 100 can be selected as follows: 0.20% to 0.6% of silicon (Si), 0.3% to 0.8% of iron (Fe), 0.1% to 0.3% of copper (Cu), 0.1% to 1% of manganese (Mn), 0.5% to 5% of magnesium (Mg), 0.1% to 0.5% of chromium (Cr), 0.1% to 0.4% of zinc (Zn), 0.05% to 0.3% of titanium (Ti), and the rest being aluminum (Al). Alternatively, the composition and ratio of the aluminum alloy material can be changed and/or complemented depending on the application of the lead-frame.

The manufacturing process of a power semiconductor package with an aluminum alloy lead-frame of the invention can be described as follows. First, a first metal electroplating layer (such as a zinc electroplating layer) is electroplated on the surface of the aluminum alloy lead-frame made with the above described aluminum alloy material. Then, a second metal electroplating layer (such as a nickel electroplating layer) is electroplated on the aluminum alloy lead-frame to cover the first metal electroplating layer. Furthermore, a third metal electroplating layer (such as a copper electroplating layer) is electroplated on the aluminum alloy lead-frame to cover the second metal electroplating layer. None of the first metal electroplating layer, the second metal electroplating layer and the third metal electroplating layer is a noble metal electroplating layer. The lead-frame electroplated with the first metal electroplating layer, the second metal electroplating layer and the third metal electroplating layer is then used in the fabrication process of a power semiconductor package including chip connecting, wire bonding, and plastic molding. In the plastic molding, only a portion of the third metal plating layer is covered by the molding compound. The remaining area of the lead-frame not covered by the molding compound is easily oxidized when exposing to air. As a result, after finishing the plastic molding, the area of the lead-frame not covered by the molding compound is electroplated with a fourth metal electroplating layer that includes a low cost metal and is not easy to be oxidized when exposing to air, for example a tin electroplating layer.

Figure 1B:
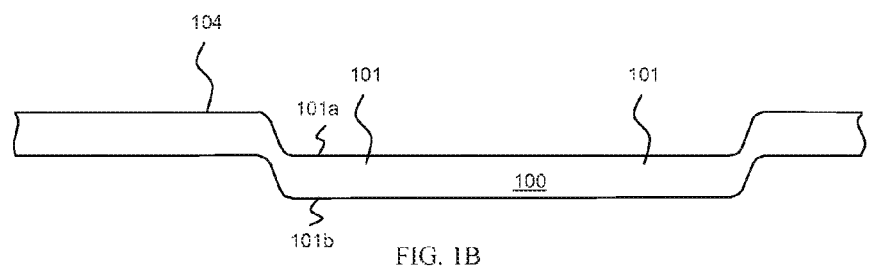
FIG. 1B is a cross-sectional diagram of the lead-frame along a line A-A.

A manufacturing process of the power semiconductor package of the present invention is described in FIGS. 1A-6B. As shown in FIG. 1A, in the lead-frame unit 100A, the pins 102, 103 and 104 are arranged at one side of the chip mounting area 101. The pin connecting areas 102a and 103a are spaced-apart and separated from the chip mounting area 101 and arranged along the edge of the chip mounting area 101. The pin 104 is directly connected to the chip mounting area 101 at the internal pin 104a. The pins 102, 103 and 104 can be arranged either in the same plane or different plane with the chip mounting area 101. FIG. 1B is a cross-sectional diagram of the lead-frame 100 along a line A-A of FIG. 1A. As shown in FIG. 1B, the pins 102, 103 and 104 are arranged in a plane higher than the plane of the chip mounting area 101.

Figure 2A:
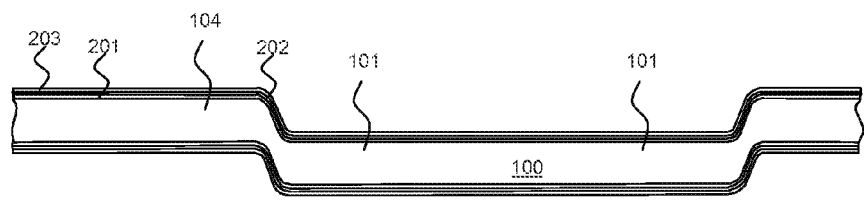
FIG. 2A is a cross-sectional diagram of a lead-frame electroplated with a first metal electroplating layer, a second metal electroplating layer and a third metal electroplating layer.
Figure 2B:
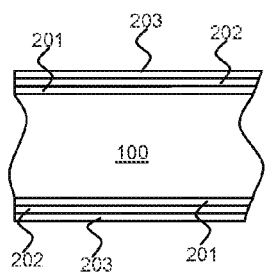
FIG. 2B is a cross-sectional diagram for amplifying the first, second and third metal electroplating layers.

As shown in FIG. 2A, a first metal electroplating layer 201 is electroplated on the surface of the lead-frame 100, preferably a zinc electroplating layer. A second metal electroplating layer 202 is then electroplated on the lead-frame 100 to cover the first metal electroplating layer 201, preferably a nickel electroplating layer. Optionally, the nickel electroplating layer can be formed on the surface of the lead-frame 100 first then the zinc electroplating layer can be formed on the nickel electroplating layer. Then a third metal electroplating layer 203 is electroplated on the lead-frame 100 covering the second metal electroplating layer 202. The third metal electroplating layer 203 is preferably a copper electroplating layer. The first metal electroplating layer 201, the second metal electroplating layer 202 and the third metal electroplating layer 203 do not require any noble metal electroplating layer. FIG. 2B is a cross-sectional schematic diagram of an enlarged portion of lead-frame 100 electroplated with the first metal electroplating layer 201, the second metal electroplating layer 202 and the third metal electroplating layer 203 in sequence.

Figure 3A:
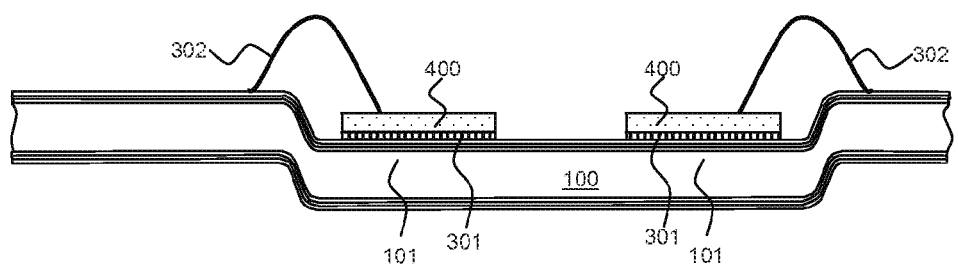
FIGS. 3A-3B are cross-sectional and top view diagrams of the lead frame after attaching a chip on a chip mounting pad of the lead-frame and connecting electrodes of the chip to a pin connecting area.
Figure 3B:
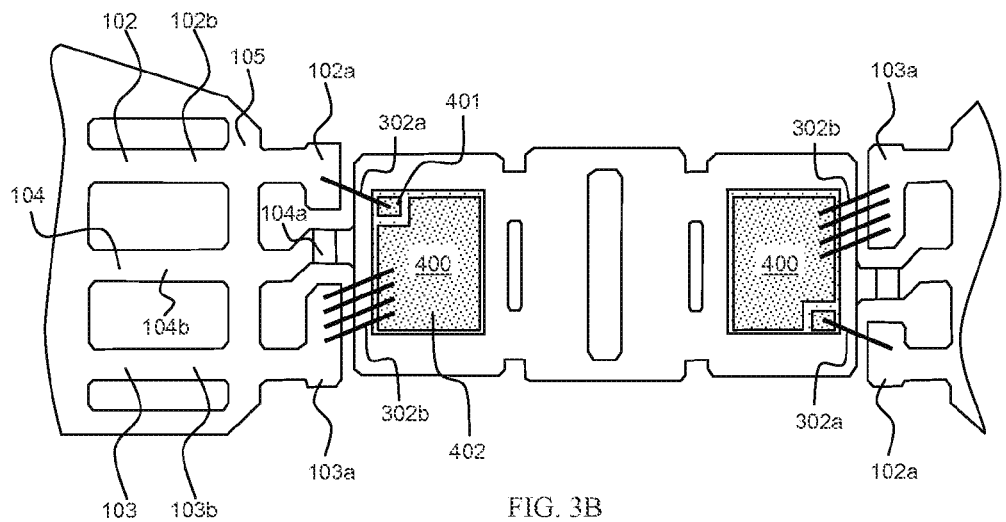

As shown in FIGS. 3A-3B, a semiconductor chip 400 is attached on the chip mounting area 101 of each lead-frame unit 100A. Particularly, the backside of the chip 400 is directly attached on the third metal plating layer 203 electroplated at the top surface of the chip mounting area 101. The chip 400 is generally a vertical power device, such as, a vertical power MOSFET (Metal-Oxide-Semiconductor Field Effect Transistor). The first and second electrodes 401 and 402 are arranged at the front surface of the chip 400, which are insulated from each other through a passivation layer (not shown). The third electrode is arranged at the backside of the chip 400 (not shown), which is attached on the third electroplating layer 203 through a conductive adhesive material 301 (such as conductive silver paste or soldering paste and the like). In one embodiment, the first electrode 401 and the second electrode 402 of the chip 400 are respectively a gate and a source and the third electrode is a drain of a vertical power MOSFET.

After the chip 400 is attached on the lead-frame unit 100A, a plurality of bonding wires 302 are formed to electrically connect the electrodes arranged at the front surface of the chip 400 to the pin connecting areas in different pins. The bonding wires 302 include bonding wire 302a and 302b. As shown in FIG. 3B, the first electrode 401 is electrically connected to the pin connecting area 102a of the pin 102 via the bonding wire 302a, and the second electrode 402 is electrically connected to the pin connecting area 103a of the pin 103 by the bonding wire 302b. The bonding wire 302a is in direct contact with the third metal electroplating layer 203 that is the outermost layer of the pin connecting area 102a. As described above, the third metal electroplating layer 203 covers the first metal electroplating layer 201 and the second metal electroplating layer 202 electroplated on the pin connecting area 102a in sequence. Similarly, the bonding lead 302b is also in direct contact with the third metal electroplating layer 203 of the pin connecting area 103a. The pin 103 is preferably in an L-shaped structure, in which, the pin connecting area 103a is perpendicular to the external pin 103b and is extended along the edge of the chip mounting area 101, thus providing a larger connecting area for a plurality of bonding wires 302b to bond thereon for larger currents passing through the second electrode 402 forming the source of the vertical power MOSFET.

Figure 4:
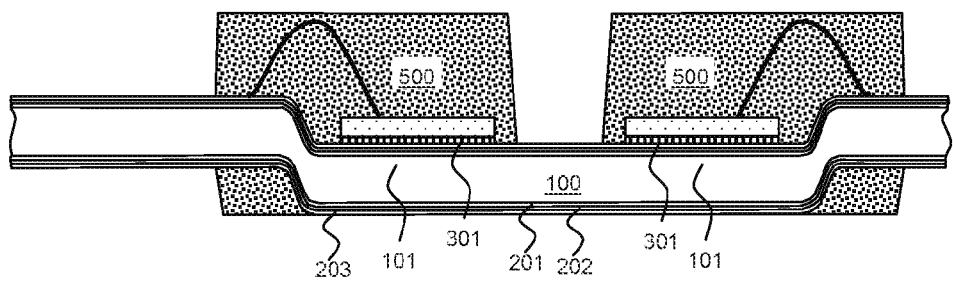
FIG. 4 is a cross-sectional diagram illustrating the chip mounting pad of the lead-frame covered by a molding compound after a packaging step.
Figure 5:
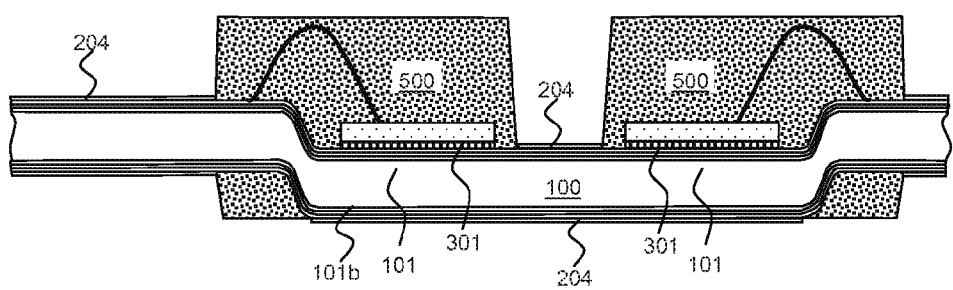
FIG. 5 is a cross-sectional diagram illustrating the electroplating of a fourth metal electroplating layer on an external pin extended out of the molding compound and at the bottom surface of a chip mounting area exposed from the molding compound.

As shown in FIG. 4, the chip 400 and the bonding wires 302 are covered by a molding compound 500 for a protection. Primarily, the molding compound 500 covering the top surface of the chip mounting area 101 is formed via the plastic molding technology, which covers the chip 400, the bonding wire 302 and all pin connecting areas 102a and 103a simultaneously. As the third metal electroplating layer 203 is an outermost layer on the lead-frame 100, the molding compound is in direct contact interfacing with and covering a portion of the third metal electroplating layer 203. The portion of the third metal electroplating layer 203 not covered by the molding compound 500 is thus exposed outside. As a result, as shown in FIG. 5, another electroplating process is required to form a fourth electroplating layer 204 on the lead frame 100 to cover the exposed portion of the third metal electroplating layer 203. The fourth electroplating layer 204 can be a tin electroplating layer. Similar to the first metal electroplating layer 201, the second metal electroplating layer 202 and the third metal electroplating layer 203, the fourth metal electroplating layer 204 are provided without a noble metal electroplating layer. As shown in FIG. 3B, the pin 102 includes the external pin 102b and the pin connecting area 102a, and the pin 103 includes the external pin 103b and the pin connecting area 103a. The external pins 102b and 103b are extended out of the molding compound 500 after finishing the molding. Therefore, the fourth metal electroplating layer 204 is also electroplated on the external pins 102b and 103b to cover the outermost third metal electroplating layer 203 on the external pins 102b and 103b. The pins 102, 103 and 104 are in a plan that can be higher than the plane of the chip mounting area 101. Furthermore, as the heat dissipation of the power chip 400 with high power consumption is large, in a preferred embodiment, the chip mounting area 101 is reset to a lower level than the external pins so that the outermost metal electroplating layer covering the bottom surface 101b can be exposed out of the molding compound 500 to improve the heat dissipation. As shown in FIG. 4 after finishing the plastic molding, the outermost third metal plating layer 203 electroplated at the bottom surface of the chip mounting area 101 is exposed out of the molding compound 500. As such, the fourth metal electroplating layer 204 is electroplated on the outermost third metal electroplating layer at the bottom surface of the chip mounting area 101 to prevent the oxidation of the third metal electroplating layer 203 and thus is exposed out of the molding compound 500. The total thickness of the first metal electroplating layer 201, the second metal electroplating layer 202 and the third metal electroplating layer 203 can be between 0.5 μm and 15 μm, and the thickness of the fourth metal electroplating layer 204 can be between 5 μm and 15 μm. It is preferred that the fourth metal electroplating layer 204 includes tin (Sn) that is not easily oxidized in air and has excellent chemical stability.

Figure 6A:
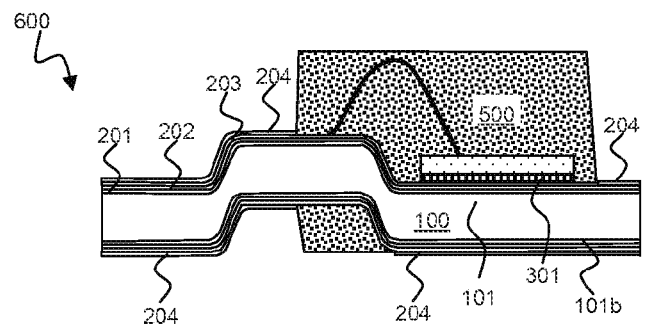
FIG. 6A is a cross-sectional schematic diagram illustrating the external pin bent to arrange the same plane with the chip mounting area.
Figure 6B:
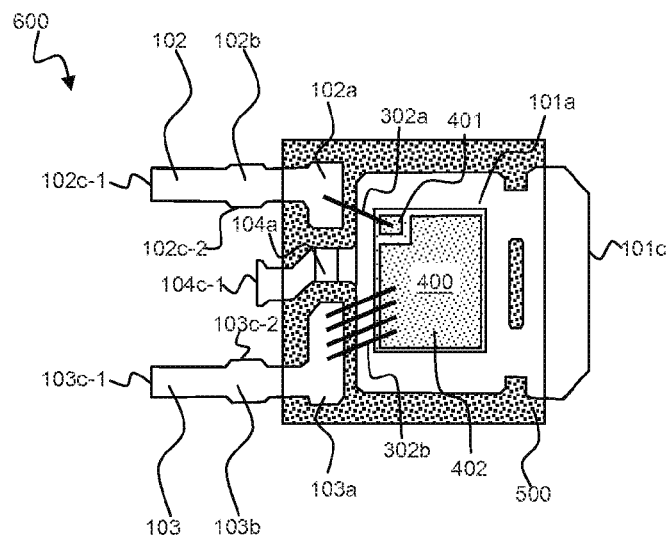
FIG. 6B is a top view schematic diagram of a surface mount type power device obtained after separating each chip mounting pad from the lead-frame.

As shown in FIGS. 6A-6B, a complete power package 600 is separated from the lead-frame 100 after the fourth metal electroplating layer 204 is deposited as described above. In this embodiment, the external pin 104*b* is trimmed, and the remained internal pin 104*a* is covered by the molding compound 500 (FIG. 6B). To be applicable to a surface mounting technology (SMT), the end portions of the external pins 102*b* and 103*b*, after the package 600 is separated from the lead-frame 100, are bent to arrange in the same plane with the chip mounting area 101 (FIG. 6A). The outermost fourth metal electroplating layer 204 at the bottom surface of the chip mounting area 101 can be connected to a larger bonding pad on a printed circuit board (PCB) through a conductive adhesive material. Similarly, the outermost fourth metal electroplating layer 204 of the external pins 102*b* and 103*b* can be connected to smaller bonding pad on the printed circuit board (PCB). The bottom surface of the chip mounting area 101 can be used as an electrode and also for heat dissipation.

In addition, to extend the storage time of the aluminum alloy lead-frame, the third metal electroplating layer 203 is coated with an OSP (Organic Solderability Preservative) anti-oxidation protective layer to prevent oxidation of the third metal electroplating layer 203 in a normal environment. The OSP layer is easily and rapidly removed at a high temperature during the packaging process, for example, the OSP layer can be volatilized at the high temperature in the chip mounting step, thus, the third metal electroplating layer 203 is exposed outside and has better bonding capability. As shown in FIG. 6B, the pins 102, 103 and 104 and the chip mounting area 101 are trimmed and separated from the lead-frame 100 forming cutting surfaces 102*c*-1, 103*c*-1, 104*c*-1, and 101*c* respectively. Furthermore, the connecting band 105 is trimmed to separate pins 102, 103 and 104 and forming a cutting surface 102*c*-2 on the pin 102, a cutting surface 103*c*-2 on the pin 103. The cutting surfaces 102*c*-1, 102*c*-2 and 104*c*-1 and the cutting surfaces 103*c*-1, 103*c*-2 and 101*c* are not covered by any electroplating layer, thus, the aluminum alloy material forming the pins 102, 103, 104 and the chip mounting area 101 is directly exposed at the cutting surfaces 102*c*-1 and 102*c*-2, 103*c*-1 and 103*c*-2, 104*c*-1 and 101*c* respectively.

Figure 7A:
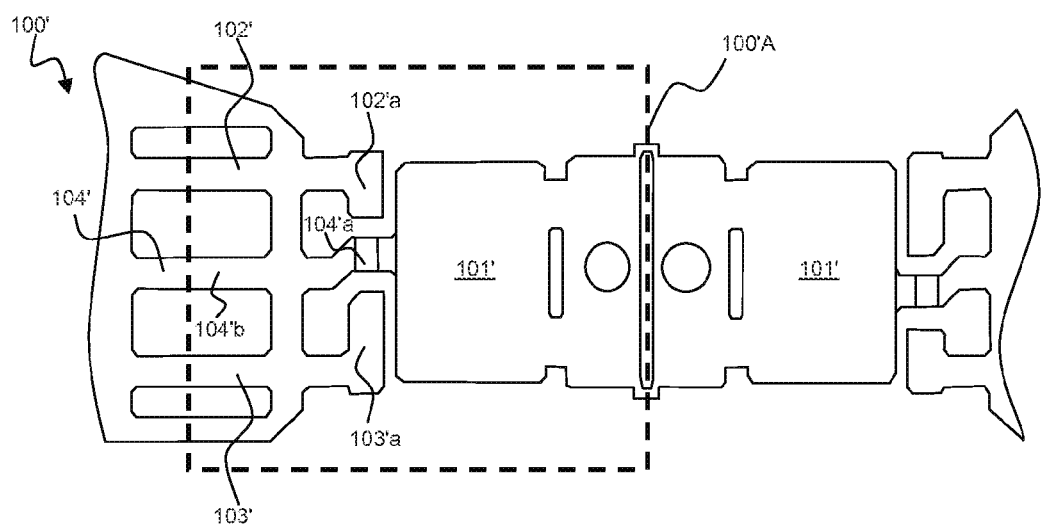
FIG. 7A is a top view diagram of a lead-frame in another embodiment of the application.
Figure 7B:
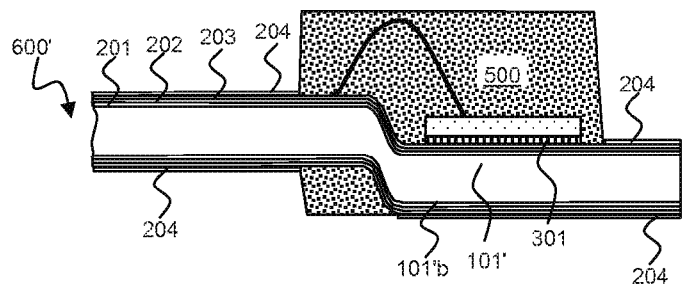
FIG. 7B is a cross-sectional schematic diagram of a plug-in power device obtained after separating each chip mounting pad from the lead-frame.
Figure 7C:
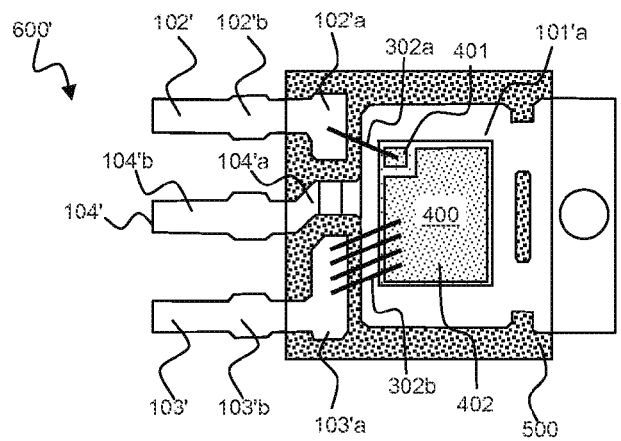
FIG. 7C is a top view diagram of the plug-in power device.

The lead-frame 100' shown in FIG. 7A is similar to the lead-frame 100 shown in FIG. 1A, and the preparation of the power package 600' shown in FIG. 7B is similar to the preparation of the power package 600 as shown in FIGS. 1A-5. After the fourth metal electroplating layer 204 is formed on the lead-frame 100', the packaging body 600' is trimmed and separated from the lead-frame 100'. The only difference between power package 600 and power package 600' is that the external pin 104'*b* of the pin 104' is not cut off, therefore the external pins 104'*b*, 102'*b* and 103'*b* are extend out of the molding compound 500 simultaneously. Therefore, the external pins 102'*b*, 103'*b* and 104'*b* trimmed and separated from the lead-frame 100' are also bent to arrange in the same plane with the chip mounting area 101' (FIG. 7B) and are covered with the fourth metal electroplating layer 204. The internal pin 104'*a* is covered with the molding compound 500 and connected to the chip mounting area 101', thus it is electrically connected to the drain at the bottom of the chip 400 forming a drain terminal. The power package 600' is in a plug-in (Insert device) packaging form with the external pins 102'*b*, 103'*b* and 104'*b* arranged in the same plane and into a row at one side of the chip mounting unit 100'A, which can be inserted into jack joints on a circuit board. Similarly as described above, in one embodiment, the third metal electroplating layer 203 is covered with an organic OSP anti-oxidation protective layer for the lead-frame's protection.

Figures 1, 8A:
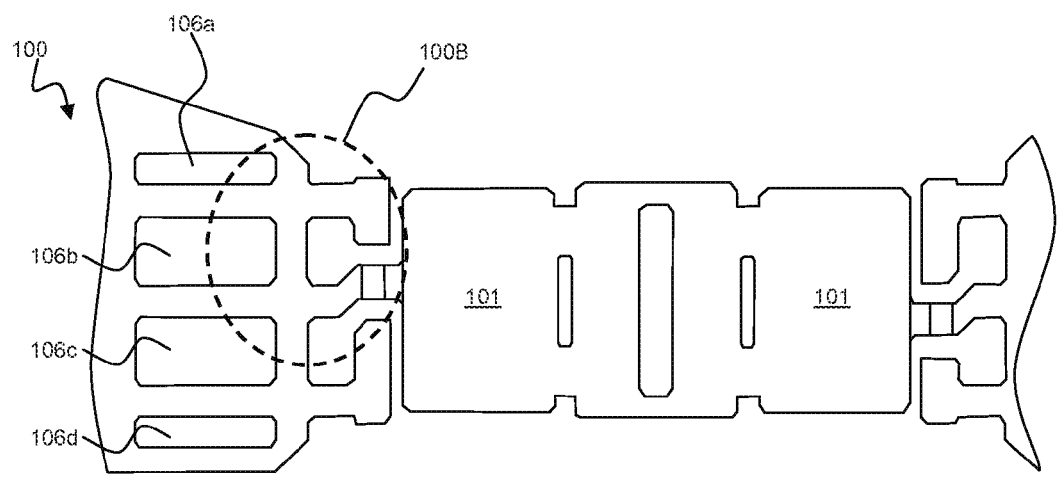
FIG. 8A-1 is a top view diagram of a lead-frame of the type depicted in FIG. 1A.
Figures 2, 8A:
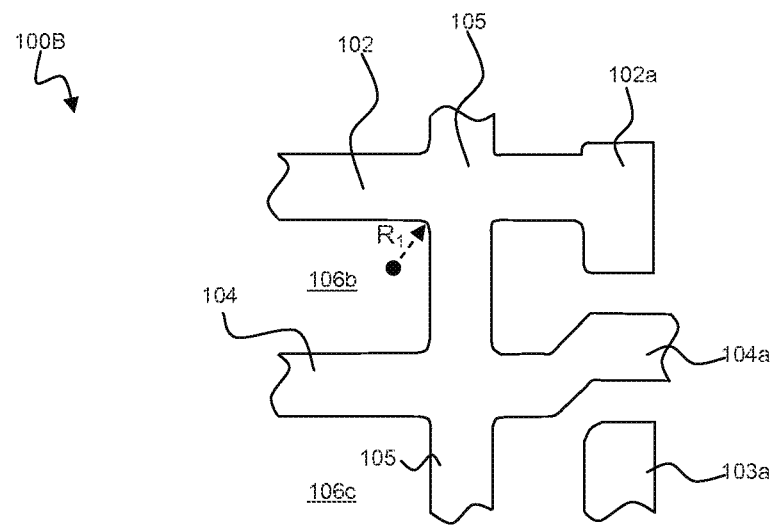
Figure 8B:
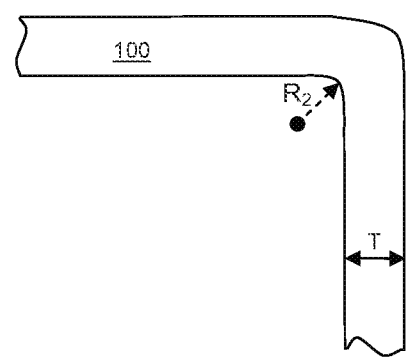
FIG. 8B is a cross-sectional diagram illustrating a segment of the lead-frame having a bending angle.

In addition, the lead-frame structure of the present invention includes controlled punching angle and/or bending angle to prevent the aluminum alloy lead-frame from cracking or breaking when it is punched or bent. As described above in FIG. 1B, the pins 102, 103 and 104 are not arranged in the same plane with the chip mounting area 101. In order to manufacture the above structure, the connecting part of an engaged pin and the chip mounting area 101 should be bent. For example, as shown in FIG. 6A, the external pins 102*a* and 103*a* of the pins 102 and 103 are bent to arrange in the same plane with the chip mounting area 101 by a punching or bending force. Sharp bending at the connecting part could easily cause cracking leading to quality and reliability concerns, and on the other hand, slow bending would require enlarging the size of the lead-frame to provide enough transition space at the connecting part, thus adversely affect the effort to miniature the device size. The designs illustrated in FIGS. 8A-1 to 8A-2 and FIG. 8B effectively solve these problems by providing an optimized lead-frame structure. It is assumed that the total thickness of the lead-frame 100 is T (mm). If the punching fillet radius R1 of the punching angle of the lead-frame is limited between 0.5 T (mm) and 2 T (mm), the aluminum alloy lead-frame made by the above mentioned alloy composition and ratio is not easy to crack. As shown in FIG. 8A-1, the supporting part of the lead-frame is removed by a punching process or the other similar methods, and the remaining part of the lead-frame such as the pins and the chip mounting area are retained. Furthermore, in the step of punching the lead-frame 100, punching windows, such as windows 106*a*, 106*b*, 106*c* and 106*d* shown in FIG. 8A-1, can be formed in a determined area of the lead-frame 100 so that the pins, the connecting band or the chip mounting area are remained after punching process. Specifically, as shown in 8A-1, a lead-frame segment 100B framed by the dotted line in the lead-frame unit 100A illustrates the limit punching fillet radius. The lead-frame segment 100B is enlarged as shown in FIG. 8A-2. A punching window 106*b* adjacent to the pins 102 and 104 and the connecting band 105 is selected as an example, in which, each punching angle in the punching window 106*b* is not a right angle, instead, each punching angle has a punching fillet radius R1 in a range of 0.5 T to 2 T (mm). Similarly, the bending fillet radius of the bending angle of the lead-frame is also controlled. For example, if the bending fillet radius R2 of the bending angle shown in FIG. 8B is limited in a range of 0.5 T to 3 T (mm), the aluminum alloy lead-frame prepared by above-described alloy composition and ratio is not easy to crack.

Furthermore, the lead-frame 100 is electroplated with various metal electroplating layers with a predetermined thickness. To prevent the electroplated lead-frame from being cracked, the design of the lead-frame is limited by the following conditions. If the thickness of the lead-frame is T (mm) and the total thickness of the first metal electroplating layer 201, the second metal electroplating layer 202, the third metal electroplating layer 203 and the fourth metal electroplating layer 204 is D (mm), the punching fillet radius of the lead-frame 100 is limited between 0.5(T+D) (mm) and 2(T+D) (mm) and the bending fillet radius of the lead-frame 100 is limited between 0.5(T+D) (mm) and 3(T+D) (mm).

Although the invention discloses the current preferable embodiments, the contents are not limitations. Various changes and corrections are undoubtedly obvious after the technical personnel of the field reading the specification. Therefore, the attached claims are considered to be all the changes and corrections covering the true concept and scope of the invention. Any and all equivalent scopes and contents within the claims are deemed to be within the intention and scope of the invention.

The invention claimed is:

1. A method for preparing a power semiconductor package using an aluminum alloy lead-frame comprising a plurality of chip mounting areas and a plurality of pins arranged along a periphery of the chip mounting areas, the method comprising the steps of:
   electroplating a first metal electroplating layer, a second metal electroplating layer and a third metal electroplating layer on the surface of the lead-frame in sequence;
   attaching a semiconductor chip at a top surface of the chip mounting area, and electrically connecting a plurality of electrodes arranged at a front surface of the semiconductor chip to corresponding pin connecting areas in different pins through a plurality of bonding wires;
   depositing a molding compound to encapsulate a portion of the top surface of the chip mounting area as well as the semiconductor chip, the bonding wires and the pin connecting area; and
   electroplating a fourth metal electroplating layer on the third metal electroplating layer at an external portion of each pin extending outside of the molding compound wherein the first metal electroplating layer, the second metal electroplating layer and the third metal electroplating layer are provided without a noble metal electroplating layer.

2. A method for preparing a power semiconductor package using an aluminum alloy lead-frame comprising a plurality of chip mounting areas and a plurality of pins arranged along a periphery of the chip mounting areas, the method comprising the steps of:
   electroplating a first metal electroplating layer, a second metal electroplating layer and a third metal electroplating layer on the surface of the lead-frame in sequence;
   attaching a semiconductor chip at a top surface of the chip mounting area, and electrically connecting a plurality of electrodes arranged at a front surface of the semiconductor chip to corresponding pin connecting areas in different pins through a plurality of bonding wires;
   depositing a molding compound to encapsulate a portion of the top surface of the chip mounting area as well as the semiconductor chip, the bonding wires and the pin connecting area; and
   electroplating a fourth metal electroplating layer on the third metal electroplating layer at an external portion of each pin extending outside of the molding compound wherein the first metal electroplating layer comprise a zinc electroplating layer, and the second metal electroplating layer comprise a nickel electroplating layer.

3. A method for preparing a power semiconductor package using an aluminum alloy lead-frame comprising a plurality of chip mounting areas and a plurality of pins arranged along a periphery of the chip mounting areas, the method comprising the steps of:
   electroplating a first metal electroplating layer, a second metal electroplating layer and a third metal electroplating layer on the surface of the lead-frame in sequence;
   attaching a semiconductor chip at a top surface of the chip mounting area, and electrically connecting a plurality of electrodes arranged at a front surface of the semiconductor chip to corresponding pin connecting areas in different pins through a plurality of bonding wires;
   depositing a molding compound to encapsulate a portion of the top surface of the chip mounting area as well as the semiconductor chip, the bonding wires and the pin connecting area; and
   electroplating a fourth metal electroplating layer on the third metal electroplating layer at an external portion of each pin extending outside of the molding compound wherein the third metal electroplating layer comprise a copper electroplating layer.

4. A method for preparing a power semiconductor package using an aluminum alloy lead-frame comprising a plurality of chip mounting areas and a plurality of pins arranged along a periphery of the chip mounting areas, the method comprising the steps of:
   electroplating a first metal electroplating layer, a second metal electroplating layer and a third metal electroplating layer on the surface of the lead-frame in sequence;
   attaching a semiconductor chip at a top surface of the chip mounting area, and electrically connecting a plurality of electrodes arranged at a front surface of the semiconductor chip to corresponding pin connecting areas in different pins through a plurality of bonding wires;
   depositing a molding compound to encapsulate a portion of the top surface of the chip mounting area as well as the semiconductor chip, the bonding wires and the pin connecting area; and
   electroplating a fourth metal electroplating layer on the third metal electroplating layer at an external portion of each pin extending outside of the molding compound wherein the fourth metal electroplating layer comprise a tin electroplating layer.

5. The method of claim 1, wherein the aluminum alloy forming the lead-frame comprises 0.20% to 0.6% of silicon (Si), 0.3% to 0.8% of the iron (Fe), 0.1% to 0.3% of copper (Cu), 0.1% to 1% of manganese (Mn), 0.5% to 5% of magnesium (Mg), 0.1% to 0.5% of chromium (Cr), 0.1% to 0.4% of zinc (Zn), and 0.05% to 0.3% of titanium (Ti).

6. The method of claim 1, wherein the total thickness of the first metal electroplating layer, the second metal electroplating layer and the third metal electroplating layer is 0.5 μm to 15 μm.

7. The method of claim 1, wherein the thickness of the fourth metal electroplating layer is 5 μm to 15 μm.

8. A method for preparing a power semiconductor package using an aluminum alloy lead-frame comprising a plurality of chip mounting areas and a plurality of pins arranged along a periphery of the chip mounting areas, the method comprising the steps of:
   electroplating a first metal electroplating layer, a second metal electroplating layer and a third metal electroplating layer on the surface of the lead-frame in sequence;
   attaching a semiconductor chip at a top surface of the chip mounting area, and electrically connecting a plurality of electrodes arranged at a front surface of the semiconductor chip to corresponding pin connecting areas in different pins through a plurality of bonding wires;

depositing a molding compound to encapsulate a portion of the top surface of the chip mounting area as well as the semiconductor chip, the bonding wires and the pin connecting area; and electroplating a fourth metal electroplating layer on the third metal electroplating layer at an external portion of each pin extending outside of the molding compound wherein the total thickness of the lead-frame is T, and a punching fillet radius of a punching angle of the lead-frame is limited in a range between 0.5 T and 2 T.

9. A method for preparing a power semiconductor package using an aluminum alloy lead-frame comprising a plurality of chip mounting areas and a plurality of pins arranged along a periphery of the chip mounting areas, the method comprising the steps of:

electroplating a first metal electroplating layer, a second metal electroplating layer and a third metal electroplating layer on the surface of the lead-frame in sequence;

attaching a semiconductor chip at a top surface of the chip mounting area, and electrically connecting a plurality of electrodes arranged at a front surface of the semiconductor chip to corresponding pin connecting areas in different pins through a plurality of bonding wires;

depositing a molding compound to encapsulate a portion of the top surface of the chip mounting area as well as the semiconductor chip, the bonding wires and the pin connecting area; and electroplating a fourth metal electroplating layer on the third metal electroplating layer at an external portion of each pin extending outside of the molding compound wherein the total thickness of the lead-frame is T, and a bending fillet radius of a bending angle of the lead-frame is limited in a range between 0.5 T and 3 T.

10. A method for preparing a power semiconductor package using an aluminum alloy lead-frame comprising a plurality of chip mounting areas and a plurality of pins arranged along a periphery of the chip mounting areas, the method comprising the steps of:

electroplating a first metal electroplating layer, a second metal electroplating layer and a third metal electroplating layer on the surface of the lead-frame in sequence;

attaching a semiconductor chip at a top surface of the chip mounting area, and electrically connecting a plurality of electrodes arranged at a front surface of the semiconductor chip to corresponding pin connecting areas in different pins through a plurality of bonding wires;

depositing a molding compound to encapsulate a portion of the top surface of the chip mounting area as well as the semiconductor chip, the bonding wires and the pin connecting area; and electroplating a fourth metal electroplating layer on the third metal electroplating layer at an external portion of each pin extending outside of the molding compound wherein the process of electroplating the fourth metal electroplating layer further electroplates the fourth metal electroplating layer at a bottom of the chip mounting area, wherein the fourth metal electroplating layer overlays a portion of the first metal electroplating layer, the second metal electroplating layer and the third metal electroplating layer consecutively electroplated at the bottom of the chip mounting area exposed outside of the molding compound.

11. A method for preparing a power semiconductor package using an aluminum alloy lead-frame comprising a plurality of chip mounting areas and a plurality of pins arranged along a periphery of the chip mounting areas, the method comprising the steps of:

electroplating a first metal electroplating layer, a second metal electroplating layer and a third metal electroplating layer on the surface of the lead-frame in sequence;

attaching a semiconductor chip at a top surface of the chip mounting area, and electrically connecting a plurality of electrodes arranged at a front surface of the semiconductor chip to corresponding pin connecting areas in different pins through a plurality of bonding wires;

depositing a molding compound to encapsulate a portion of the top surface of the chip mounting area as well as the semiconductor chip, the bonding wires and the pin connecting area;

electroplating a fourth metal electroplating layer on the third metal electroplating layer at an external portion of each pin extending outside of the molding compound; and separating the pins and the chip mounting areas from other part of the lead-frame with an end face not covered by the first metal electroplating layer, the second metal electroplating layer, the third metal electroplating layer and the fourth metal electroplating layer.

12. The method of claim 1, wherein the step of attaching the semiconductor chip at the top surface of chip mounting area further attaches a bottom electrode disposed at a bottom of the semiconductor chip directly onto the third metal electroplating layer at the top surface of the chip mounting area via a conductive adhesive material.

13. A method for preparing a power semiconductor package using an aluminum alloy lead-frame comprising a plurality of chip mounting areas and a plurality of pins arranged along a periphery of the chip mounting areas, the method comprising the steps of:

electroplating a first metal electroplating layer, a second metal electroplating layer and a third metal electroplating layer on the surface of the lead-frame in sequence;

attaching a semiconductor chip at a top surface of the chip mounting area, and electrically connecting a plurality of electrodes arranged at a front surface of the semiconductor chip to corresponding pin connecting areas in different pins through a plurality of bonding wires;

depositing a molding compound to encapsulate a portion of the top surface of the chip mounting area as well as the semiconductor chip, the bonding wires and the pin connecting area;

electroplating a fourth metal electroplating layer on the third metal electroplating layer at an external portion of each pin extending outside of the molding compound; and bending an external portion of the pin such that a bottom of the pin being coplanar to a bottom of the chip mounting pad.

14. A power semiconductor package comprising:

an aluminum alloy lead-frame unit comprising a plurality of chip mounting areas and a plurality of pins arranged along a periphery of the chip mounting areas, with a first metal electroplating layer, a second metal electroplating layer and a third metal electroplating layer electroplated on the surface of the aluminum alloy lead-frame unit in sequence;

a semiconductor chip attached at a top surface of a chip mounting area, wherein a plurality of electrodes arranged at a front surface of the semiconductor chip are electrically connected to pin connecting areas of corresponding pins via a plurality of bonding wires;

a molding compound encapsulating a portion of the top surface of the chip mounting area, the semiconductor chip, the bonding wires and the pin connecting area; and a fourth metal electroplating layer electroplated onto the third metal electroplating layer at an external pin of the pins extended out of the molding compound, the fourth metal electroplating layer terminating at an edge of the molding compound wherein the first metal electroplating layer, the second metal electroplating layer, the third metal electroplating layer and the fourth metal electroplating layer are provided without a noble metal electroplating layer.

15. A power semiconductor package comprising:
an aluminum alloy lead-frame unit comprising a plurality of chip mounting areas and a plurality of pins arranged along a periphery of the chip mounting areas, with a first metal electroplating layer, a second metal electroplating layer and a third metal electroplating layer electroplated on the surface of the aluminum alloy lead-frame unit in sequence;
a semiconductor chip attached at a top surface of a chip mounting area, wherein a plurality of electrodes arranged at a front surface of the semiconductor chip are electrically connected to pin connecting areas of corresponding pins via a plurality of bonding wires;
a molding compound encapsulating a portion of the top surface of the chip mounting area, the semiconductor chip, the bonding wires and the pin connecting area; and
a fourth metal electroplating layer electroplated onto the third metal electroplating layer at an external pin of the pins extended out of the molding compound, the fourth metal electroplating layer terminating at an edge of the molding compound wherein the first metal electroplating layer is a zinc electroplating layer, and the second metal electroplating layer is a nickel electroplating layer.

16. A power semiconductor package comprising:
an aluminum alloy lead-frame unit comprising a plurality of chip mounting areas and a plurality of pins arranged along a periphery of the chip mounting areas, with a first metal electroplating layer, a second metal electroplating layer and a third metal electroplating layer electroplated on the surface of the aluminum alloy lead-frame unit in sequence;
a semiconductor chip attached at a top surface of a chip mounting area, wherein a plurality of electrodes arranged at a front surface of the semiconductor chip are electrically connected to pin connecting areas of corresponding pins via a plurality of bonding wires;
a molding compound encapsulating a portion of the top surface of the chip mounting area, the semiconductor chip, the bonding wires and the pin connecting area; and
a fourth metal electroplating layer electroplated onto the third metal electroplating layer at an external pin of the pins extended out of the molding compound, the fourth metal electroplating layer terminating at an edge of the molding compound wherein the third metal electroplating layer is a copper electroplating layer.

17. A power semiconductor package comprising:
an aluminum alloy lead-frame unit comprising a plurality of chip mounting areas and a plurality of pins arranged along a periphery of the chip mounting areas, with a first metal electroplating layer, a second metal electroplating layer and a third metal electroplating layer electroplated on the surface of the aluminum alloy lead-frame unit in sequence;
a semiconductor chip attached at a top surface of a chip mounting area, wherein a plurality of electrodes arranged at a front surface of the semiconductor chip are electrically connected to pin connecting areas of corresponding pins via a plurality of bonding wires;
a molding compound encapsulating a portion of the top surface of the chip mounting area, the semiconductor chip, the bonding wires and the pin connecting area; and
a fourth metal electroplating layer electroplated onto the third metal electroplating layer at an external pin of the pins extended out of the molding compound, the fourth metal electroplating layer terminating at an edge of the molding compound wherein the fourth metal electroplating layer is a tin electroplating layer.

18. The power semiconductor package of claim 17, wherein the aluminum alloy comprises 0.20% to 0.6% of silicon (Si), 0.3% to 0.8% of iron (Fe), 0.1% to 0.3% of copper (Cu), 0.1% to 1% of manganese (Mn), 0.5% to 5% of magnesium (Mg), 0.1% to 0.5% of chromium (Cr), 0.1% to 0.4% of zinc (Zn), and 0.05% to 0.3% of titanium (Ti).

19. The power semiconductor package of claim 17, wherein the total thickness of the first metal electroplating layer, the second metal electroplating layer and the third metal electroplating layer is 0.5 µm to 15 µm.

20. The power semiconductor package of claim 17, wherein the thickness of the fourth metal electroplating layer is 5 µm to 15 µm.

21. A power semiconductor package comprising:
an aluminum alloy lead-frame unit comprising a plurality of chip mounting areas and a plurality of pins arranged along a periphery of the chip mounting areas, with a first metal electroplating layer, a second metal electroplating layer and a third metal electroplating layer electroplated on the surface of the aluminum alloy lead-frame unit in sequence;
a semiconductor chip attached at a top surface of a chip mounting area, wherein a plurality of electrodes arranged at a front surface of the semiconductor chip are electrically connected to pin connecting areas of corresponding pins via a plurality of bonding wires;
a molding compound encapsulating a portion of the top surface of the chip mounting area, the semiconductor chip, the bonding wires and the pin connecting area; and
a fourth metal electroplating layer electroplated onto the third metal electroplating layer at an external pin of the pins extended out of the molding compound, the fourth metal electroplating layer terminating at an edge of the molding compound wherein the total thickness of the lead-frame is T, and a punching fillet radius of a punching angle of the lead-frame is limited between 0.5 T and 2 T.

22. A power semiconductor package comprising:
an aluminum alloy lead-frame unit comprising a plurality of chip mounting areas and a plurality of pins arranged along a periphery of the chip mounting areas, with a first metal electroplating layer, a
second metal electroplating layer and a third metal electroplating layer electroplated on the surface of the aluminum alloy lead-frame unit in sequence;
a semiconductor chip attached at a top surface of a chip mounting area, wherein a plurality of electrodes arranged at a front surface of the semiconductor chip are electrically connected to pin connecting areas of corresponding pins via a plurality of bonding wires;
a molding compound encapsulating a portion of the top surface of the chip mounting area, the semiconductor chip, the bonding wires and the pin connecting area; and
a fourth metal electroplating layer electroplated onto the third metal electroplating layer at an external pin of the pins extended out of the molding compound, the fourth metal electroplating layer terminating at an edge of the molding compound wherein the total thickness of the lead-frame is T, and the bending fillet radius of a bending angle of the lead-frame is limited between 0.5 T and 3 T.

23. A power semiconductor package comprising:
an aluminum alloy lead-frame unit comprising a plurality of chip mounting areas and a plurality of pins arranged along a periphery of the chip mounting areas, with a first metal electroplating layer, a second metal electroplating layer and a third metal electroplating layer electroplated on the surface of the aluminum alloy lead-frame unit in sequence;
a semiconductor chip attached at a top surface of a chip mounting area, wherein a plurality of electrodes arranged at a front surface of the semiconductor chip are electrically connected to pin connecting areas of corresponding pins via a plurality of bonding wires;
a molding compound encapsulating a portion of the top surface of the chip mounting area, the semiconductor chip, the bonding wires and the pin connecting area; and
a fourth metal electroplating layer electroplated onto the third metal electroplating layer at an external pin of the pins extended out of the molding compound, the fourth metal electroplating layer terminating at an edge of the molding compound wherein the fourth metal electroplating layer is further electroplated at a bottom surface of the chip mounting area to cover the first metal electroplating layer, the second metal electroplating layer and the third metal electroplating layer electroplated at the bottom surface of the chip mounting area, thus the fourth metal electroplating layer is exposed out of the molding compound.

24. A power semiconductor package comprising:
an aluminum alloy lead-frame unit comprising a plurality of chip mounting areas and a plurality of bins arranged along a periphery of the chip mounting areas, with a first metal electroplating la e a second metal electroplating layer and a third metal electroplating layer electroplated on the surface of the aluminum alloy lead-frame unit in sequence;
a semiconductor chip attached at a top surface of a chip mounting area, wherein a plurality of electrodes arranged at a front surface of the semiconductor chip are electrically connected to pin connecting areas of corresponding pins via a plurality of bonding wires;
a molding compound encapsulating a portion of the top surface of the chip mounting area, the semiconductor chip, the bonding wires and the pin connecting area; and
a fourth metal electroplating layer electroplated onto the third metal electroplating layer at an external pin of the pins extended out of the molding compound, the fourth metal electroplating layer terminating at an edge of the molding compound wherein cutting faces formed at the end of the pins are exposed out of the first metal electroplating layer, the second metal electroplating layer, the third metal electroplating layer and the fourth metal electroplating layer.

25. A power semiconductor package comprising:
an aluminum alloy lead-frame unit comprises a plurality of chip mounting areas and a plurality of pins arranged along the periphery of the chip mounting areas with a first metal electroplating layer, a
second metal electroplating layer and a third metal electroplating layer electroplated on the surface of the aluminum alloy lead-frame unit;
a semiconductor chip arranged at a top surface of a chip mounting area, wherein a plurality of electrodes arranged at a front of the chip are electrically connected to a pin connecting area of corresponding pins via a plurality of bonding wires;
a molding compound encapsulating a portion of the top surface of the chip mounting area, the semiconductor chip, the bonding wires and the pin connecting area; and
wherein the total thickness of the lead-frame is T, a punching fillet radius of a punching angle of the lead-frame is limited between 0.5 T and 2 T, and a bending fillet radius of a bending angle of the lead-frame is limited between 0.5 T and 3 T.

* * * * *